United States Patent [19]

Bee

[11] Patent Number: 5,426,396
[45] Date of Patent: Jun. 20, 1995

[54] DIFFERENTIAL AMPLIFIER MULTIPLEXER

[75] Inventor: Edward C. Bee, San Jose, Calif.

[73] Assignee: Elantec, Inc., Milpitas, Calif.

[21] Appl. No.: 225,131

[22] Filed: Apr. 7, 1994

[51] Int. Cl.[6] .............................................. H03F 3/45
[52] U.S. Cl. .................................... 330/253; 327/408
[58] Field of Search ............... 307/231, 448, 451, 494, 307/497; 330/252, 253, 277; 370/27

[56] References Cited

U.S. PATENT DOCUMENTS 3,877,023 4/1975 Spicer et al. ...................... 330/253 X
4,859,963 8/1989 Schaffer ............................ 330/253

*Primary Examiner*—Steven Mottola
*Attorney, Agent, or Firm*—Albert C. Smith

[57] ABSTRACT

A multiplexer circuit includes pairs of control elements such as CMOS transistors serially connected between common circuit nodes to conduct current therebetween in response to one of each pair of control elements being selectively biased to conductive or non-conductive states by an applied control signal. The current enabled to flow between circuit nodes through a pair of control elements biased to conductive state is determined by the magnitude of an applied signal, and a current-difference circuit compares the current flowing between circuit nodes with a reference current to produce an output signal representative of the applied signal which is selected in response to an applied control signal.

4 Claims, 1 Drawing Sheet

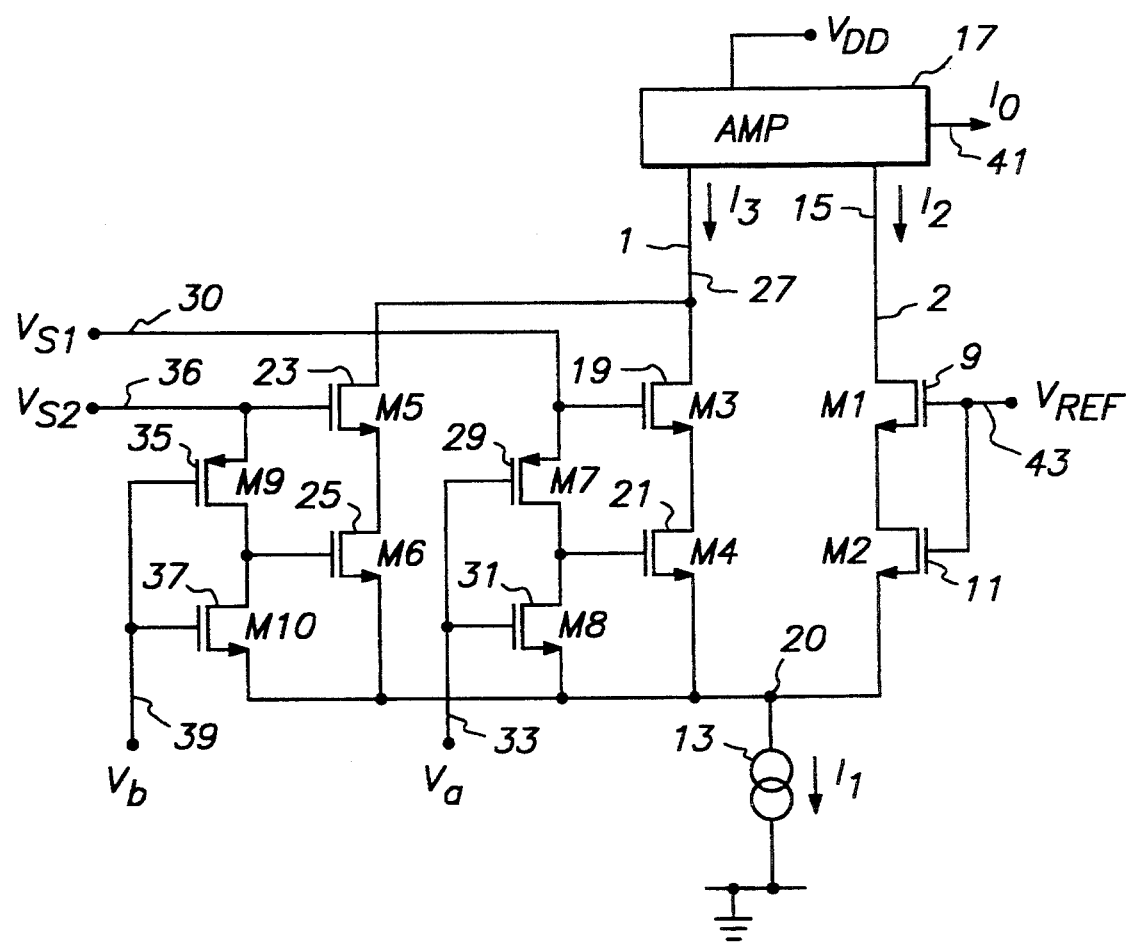

5,426,396

DIFFERENTIAL AMPLIFIER MULTIPLEXER

FIELD OF THE INVENTION

This invention relates to differential amplifiers and more particularly to circuitry for selectively switching multiple input signals to the inputs of an analog differential signal stage.

BACKGROUND OF THE INVENTION

Certain known circuits for selectively switching analog signals to the inputs of a multiple-input signal processing stage, such as a differential amplifier or comparator, commonly rely upon switches in each signal input that include, for example, CMOS-type transistors that can be selectively triggered on or off to selectively pass or block the applied analog signals. However, circuits of this type commonly include significant resistance in the conduction mode of such transistor switches which, coupled with input capacitance of the following signal stage, significantly affects high-frequency signal transmission through the low-pass filter thus formed.

Alternatively, analog input signals may be selectively applied to the inputs of a multi-input signal processing stage via separate buffer amplifiers which can be selectively biased to enable and disable application of input signals to the inputs of the signal processing stage. However, such buffer amplifiers commonly introduce undesirable circuit complexity and offset voltages.

Still other known schemes for controlling the application of multiple analog signals to the inputs of an analog differential amplifier include cascaded pairs of differentially-connected transistors which are switched by transistors in the collector (or drain) circuits of each differential input pair of transistors. However, such circuits typically limit the range of signal levels over which high common-mode rejection can be achieved.

SUMMARY OF THE INVENTION

Accordingly, in one embodiment of the present invention, pairs of gated transistors are serially coupled to form input stages of a differential amplifier, and control transistors are connected to the gates of input stages for controlling the application of the input signals and the conductivity of selected ones of the pairs of serially-coupled transistors. The conduction current through a pair of gated transistors of same conductivity type that form an input stage is compared with a reference current, and the difference of current levels in an input stage relative to the reference current is amplified and supplied as an output to following stages. The control transistors include pairs of gated transistors of opposite conductivity types forming connections to the gates of transistors in each input stage and commonly controlled in pairs by control signals applied to the gates of such serially-connected control transistors. In this way, switching of current sources to different stages with associated transient effects are substantially eliminated, and undesirable signal coupling through an 'off' input stage is substantially eliminated.

DESCRIPTION OF THE DRAWING

The drawing is a block schematic diagram of the illustrated embodiment of the present invention.

DESCRIPTION OF THE PREFERRED EMBODIMENT

Referring now to the drawing, there is shown a block schematic diagram of one embodiment of the present invention in which a first pair of gated transistor devices 9, 11 of one conductivity type have source and drain output electrodes serially connected between a current source 13 and an input 15 of a current-difference amplifier 17. Second and third pairs of gated devices 19, 21 and 23, 25 have source and drain electrodes serially connected between the current source 13 and another input 27 of the current-difference amplifier 17. Gate (or input) electrodes of the second pair of devices 19, 21 are coupled together through the source and drain electrodes of gated transistor 29 of opposite conductivity type. One input signal $V_{s1}$ 30 is applied to the gate of device 19 in the second pair, and the source and drain electrodes of another gated transistor 31 of the one conductivity type connects the gate of the device 21 in the second pair to the node 20 in common connection with the current source 13. The gates of the devices 29 and 31 are connected in common to receive one control signal $V_a$ 33.

Similarly, gate electrodes of the third pair of devices 23, 25 are coupled together through the source and drain electrodes of gated transistor 35 of the opposite conductivity type. Another input signal $V_{s2}$ 36 is applied to the gate of device 23 in the third pair, and the source and drain electrodes of another gated transistor 37 of the one conductivity type connects the gate of device 25 in the third pair to the node 20 in common connection with the current source 13. The gates of the devices 35 and 37 are connected in common to receive another control signal $V_b$ 39. The gates of the devices 9, 11 in the first pair are connected to receive $V_{REF}$ 43 for bias to conduction, and the current-difference amplifier 17 produces an output current $I_0$ on line 41 proportional to the difference of the input currents $I_2$ and $I_3$ at the inputs 15,27.

In operation, the first pair of devices 9, 11 on one side and the second pair of devices 19, 21 (or, the third pair of devices 23, 25) on another side comprise a differential input stage for one input signal $V_{s1}$ 30 (or, for another input signal $V_{s2}$ 36) relative to $V_{REF}$ 43. With a control signal Va 33 high and control signal Vb 39 low for the connections of the conductivity type transistors as illustrated, then devices 23 and 25 form the differential input stage with devices 9, 11 for an input signal $V_{s2}$ 36 which thus compares the magnitudes and polarity of $V_{REF}$ 43 and the input signal $V_{s2}$ 36 to establish at the inputs 15, 27 of the amplifier 17 the ratio of currents $I_3$ and $I_2$ that flow from the source 13 of current $I_1$. With control voltage Vb 39 in the low state while control voltage Va 33 is in the high state, then device 35 is biased conductive, or ON, and device 37 is biased non-conductive, or OFF. Thus, input signal $V_{s2}$ 36 is applied through device 35 to both of the devices 23, 25 in the third pair to drive, i.e., control the conductivity of such devices in the same way as the $V_{REF}$ 43 drives or controls the conductivity of the devices 9, 11 in the first pair. At the same time for the condition of signals Va 33 and Vb 39 as previously specified, the device 29 is biased non-conductive, or OFF, and device 31 is biased conductive, or ON, effectively biasing device 21 to very low conductance, or OFF, compared with the devices 23, 25 and 9, 11 biased to the conductive condition. In this bias condition of devices 9, 11, device 9 operates in the 'saturated', or voltage-controlled current source region, and device 11 operates in the linear resistive region of a typical MOSFET. The value of $I_2$ will thus be dependent upon the gate-source voltage between nodes 20 and 43 across device 9 and also across device 11 (where device 11 actually operates as a source degeneration resistor for device 9).

Similarly, if control signal Va 33 is low and control signal Vb 39 is high for the connections of the conductivity type transistors, as illustrated, then the device 29 is biased ON to connect together the gates of devices 29, 31 in the second pair, and to bias the device 31 OFF, while at the same time biasing device 37 ON which effectively biases device 25 OFF to isolate the input signal $Vs_2$ 36 from affecting current in the input 27 of the amplifier 17. The amplifier 17 thus compares the magnitudes and polarity of $V_{REF}$ 43 and the input signal $Vs_1$ 30 to establish the ratio of current $I_3$ and $I_2$ at the inputs 15, 27 of the amplifier 17.

The circuit of the illustrated embodiment and the associated operation thereof as previously described provides the advantage that the input signals $Vs_1$ 30 and $Vs_2$ 36 are directly applied to the input of the differential amplifier (formed by the first pair of devices 9, 11 and either the second pair of devices 19, 21 or the third pair of devices 23, 25) without loss or distortion of the applied signal. In addition, there is no switching required of current sources since current source 13 remains active with only minimum disturbances in $I_2$ and $I_3$, and with only minimum output transients 41 upon switching of control signals Va 33 and Vb 39. The amplifier 17 of conventional design translates the difference of currents $I_2$ 15 and $I_3$ 27 to a proportional output current $I_o$ 41 for connection to following gain stages or other signal-processing stages in conventional manner. The amplifier 17 as an active load can have a number of different conventional configurations. For example, one common form of amplifier 17 converts differential current inputs to a single-ended output current to drive a succeeding stage.

In addition, since the input node 27 of amplifier 17 is typically low impedance for a current amplifier, then the only coupling of input signal is through the tiny gate capacitance of the device 19 or 23 (that is in the serial pair of devices which is biased OFF by the received input signal $Vs_1$ 30 or $Vs_2$ 36, respectively) to such input node 27, with only negligible effect.

Of course, it should be understood that the circuit of the present invention may be formed with the conductivity types of the gated devices 9, 11 19, 21, 29, 31, 23, 25, 35 and 37 reversed, and with associated reversals of current direction of source 13 and reversals of polarities of $V_{REF}$ and Va and Vs for similar operation as previously described.

What is claimed is:

1. A multiplexer circuit comprising:
    first and second pairs of control elements of one conductivity type, each including a pair of output electrodes and a control electrode, with the output electrodes of the control elements in each of the first and second pairs serially connected to form current paths of selectively controllable conductivity between first and second nodes;
    first and second auxiliary control elements of said one conductivity type each having a pair of output electrodes and a control electrode, with the output electrodes of each of the first and second auxiliary control elements connected between the first node and control electrodes of corresponding ones of the first and second pairs of control elements;
    a first circuit coupling first and second applied signals to the control electrodes of the corresponding other ones of the first and second pairs of control elements;
    third and fourth auxiliary control elements of opposite conductivity type each having a pair of output electrodes and a control electrode, with the output electrodes of each of the third and fourth auxiliary control elements connected between the control electrodes of corresponding ones of the first and second pairs of control elements;
    a second circuit coupling a first control signal to each of the control electrodes of the first and third control elements;
    a third circuit coupling a second control signal to each of the control electrodes of the second and fourth control elements;
    a source of current connected to supply current to the first node;
    a conduction circuit connecting the first node to a third node; and
    a fourth circuit having a pair of inputs connected to the second and third nodes for converting the difference of currents in the second and third nodes to an output indicative of a selected one of the first and second applied signals that is operative to control current from the first node to the second node in response to an applied control signal.

2. A multiplexer circuit comprising:
    first and second pairs of control elements of one conductivity type, each including a pair of output electrodes and a control electrode, with the output electrodes of the control elements in each of the first and second pairs serially connected to form current paths of selectively controllable conductivity between first and second nodes;
    first and second auxiliary control elements of said one conductivity type each having a pair of output electrodes and a control electrode, with the output electrodes of each of the first and second auxiliary control elements connected between the first node and control electrodes of corresponding ones of the first and second pairs of control elements;
    a first circuit coupling first and second applied signals to the control electrodes of the corresponding other ones of the first and second pairs of control elements;
    third and fourth auxiliary control elements of opposite conductivity type each having a pair of output electrodes and a control electrode, with the output electrodes of each of the third and fourth auxiliary control elements connected between the control electrodes of corresponding ones of the first and second pairs of control elements;
    a second circuit coupling a first control signal to each of the control electrodes of the first and third control elements;
    a third circuit coupling a second control signal to each of the control electrodes of the second and fourth control elements;
    a source of current connected to supply current to the first node;
    a conduction circuit connecting the first node to a third node;
    the conduction circuit including at least one control element of said one conductivity type having a pair of output electrodes and a control electrode, with the output electrodes coupled between the first and third nodes; and a source of signal connected to the control electrode of said at least one control element for selectively controlling the current conduction therethrough between the first and third nodes.

3. A multiplexer circuit according to claim 1 wherein the control elements of said one conductivity type include N-channel CMOS devices, and the control elements of opposite conductivity type include P-channel CMOS devices.

4. A multiplexer circuit according to claim 1 wherein said conduction circuit comprises:

an additional pair of control elements each having a pair of output electrodes and a control electrode, with the output electrodes thereof serially connected between the first and third nodes for controlling conduction of current therebetween; and a source of bias signal applied in common to the control electrodes of the additional pair of control elements for establishing reference current between the first and third nodes.

* * * * *